(12) United States Patent
Agostini et al.

(10) Patent No.: US 9,958,213 B2
(45) Date of Patent: May 1, 2018

(54) HEAT EXCHANGER

(71) Applicant: ABB Schweiz AG, Zürich (CH)

(72) Inventors: Bruno Agostini, Zürich (CH); Daniele Torresin, Birmenstorf (CH); Francesco Agostini, Zürich (CH); Mathieu Habert, Rixheim (FR)

(73) Assignee: ABB Schweiz AG, Baden (CH)

( * ) Notice: Subject to any disclaimer, the term of this patent is extended or adjusted under 35 U.S.C. 154(b) by 6 days.

(21) Appl. No.: 15/204,648

(22) Filed: Jul. 7, 2016

(65) Prior Publication Data

US 2017/0010049 A1    Jan. 12, 2017

(30) Foreign Application Priority Data

Jul. 9, 2015 (EP) .................................... 15176093

(51) Int. Cl.
| | |
|---|---|
| *F28D 15/02* | (2006.01) |
| *F28D 7/00* | (2006.01) |
| *F28D 15/04* | (2006.01) |
| *F28F 3/02* | (2006.01) |
| *H05K 7/20* | (2006.01) |

(Continued)

(52) U.S. Cl.
CPC ....... *F28D 15/0266* (2013.01); *F28D 7/0075* (2013.01); *F28D 15/0233* (2013.01); *F28D 15/04* (2013.01); *F28F 3/025* (2013.01); *H01L 23/427* (2013.01); *H05K 7/20936* (2013.01); *F28D 2015/0216* (2013.01);

(Continued)

(58) Field of Classification Search
CPC .................................................. F28D 15/0266
See application file for complete search history.

(56) References Cited

U.S. PATENT DOCUMENTS

| 6,005,772 A | 12/1999 | Terao et al. | |
|---|---|---|---|
| 6,073,683 A * | 6/2000 | Osakabe | ............. F28D 15/0266 |
| | | | 165/104.21 |

(Continued)

FOREIGN PATENT DOCUMENTS

| EP | 1383170 B1 | 7/2007 |
|---|---|---|
| EP | 1383369 B1 | 7/2007 |

(Continued)

OTHER PUBLICATIONS

European Patent Office, Extended Search Report issued in corresponding Application No. 15176093.1, dated Jan. 25, 2016, 7 pp.

*Primary Examiner* — Mukund G Patel
(74) *Attorney, Agent, or Firm* — Taft Stettinius & Hollister LLP

(57) ABSTRACT

The invention relates to a heat exchanger comprising a base plate for receiving a heat load from one or more electric components, an evaporator being in thermal contact with a surface of the base plate for transferring said heat load into a first fluid in the evaporator channels, and a condenser dissipating heat from the first fluid. In order to provide an efficient heat exchanger the heat exchanger comprises a collector space receiving first fluid from the condenser, and the collector space which is located higher than the lower ends of the evaporator channels is in fluid communication with lower ends of the evaporator channels for passing first fluid received from the condenser to the lower ends of the evaporator channels.

20 Claims, 2 Drawing Sheets

(51) Int. Cl.
*H01L 23/427* (2006.01)
*F28D 21/00* (2006.01)
*H01L 23/367* (2006.01)

(52) U.S. Cl.
CPC ............... *F28D 2021/0028* (2013.01); *F28D 2021/0029* (2013.01); *H01L 23/3677* (2013.01)

(56) References Cited

U.S. PATENT DOCUMENTS 6,863,119 B2    3/2005    Sugito et al.
7,658,223 B2    2/2010    Okamoto et al.

FOREIGN PATENT DOCUMENTS

| EP | 2811251 A1 | 12/2014 |
| GB | 2173413 B | 12/1988 |
| JP | 2000213880 A | 8/2000 |

\* cited by examiner

HEAT EXCHANGER

BACKGROUND OF THE INVENTION

Field of the Invention

This invention relates to a heat exchanger, and more particularly to a heat exchanger for cooling electric components.

Description of Prior Art

Previously there is known a heat sink receiving heat from electric components and dissipating the received heat into surroundings. A problem with such a solution is an insufficient cooling capacity.

Previously there is also known a heat exchanger comprising a base plate for receiving a heat load from one or more electric components. An evaporator with evaporator channels is in thermal contact with the base plate in order to transfer the heat load into a fluid in the evaporator channels. A condenser with condenser channels is provided to receive heated fluid from the evaporator channels. The condenser dissipates heat from fluid in the condenser channels to surroundings.

The above described heat exchanger is utilized to provide two-phase cooling by arranging the condenser and evaporator in an upright position such that a lowermost part of the condenser is located at a higher level than an uppermost part of the evaporator.

In order to provide a more efficient cooling for existing devices utilizing heat sinks, it would be advantageous if the above mentioned heat sink could be replaced with a more efficient heat exchanger, as mentioned described above. However, the shape and size of known heat exchangers makes this problematic.

SUMMARY OF THE INVENTION

An object of the present invention is to provide a heat exchanger capable of providing more efficient and adequate cooling to electric components and which has a shape and size which makes it possible to use the heat exchanger in various devices, such as in existing devices in place of previously installed heat sinks. This object is achieved with a heat exchanger according to independent claim 1 and a power module according to independent claim 14.

BRIEF DESCRIPTION OF DRAWINGS

In the following the present invention will be described in closer detail by way of example and with reference to the attached drawings, in which.

DESCRIPTION OF AT LEAST ONE EMBODIMENT

Figures 1, 2:
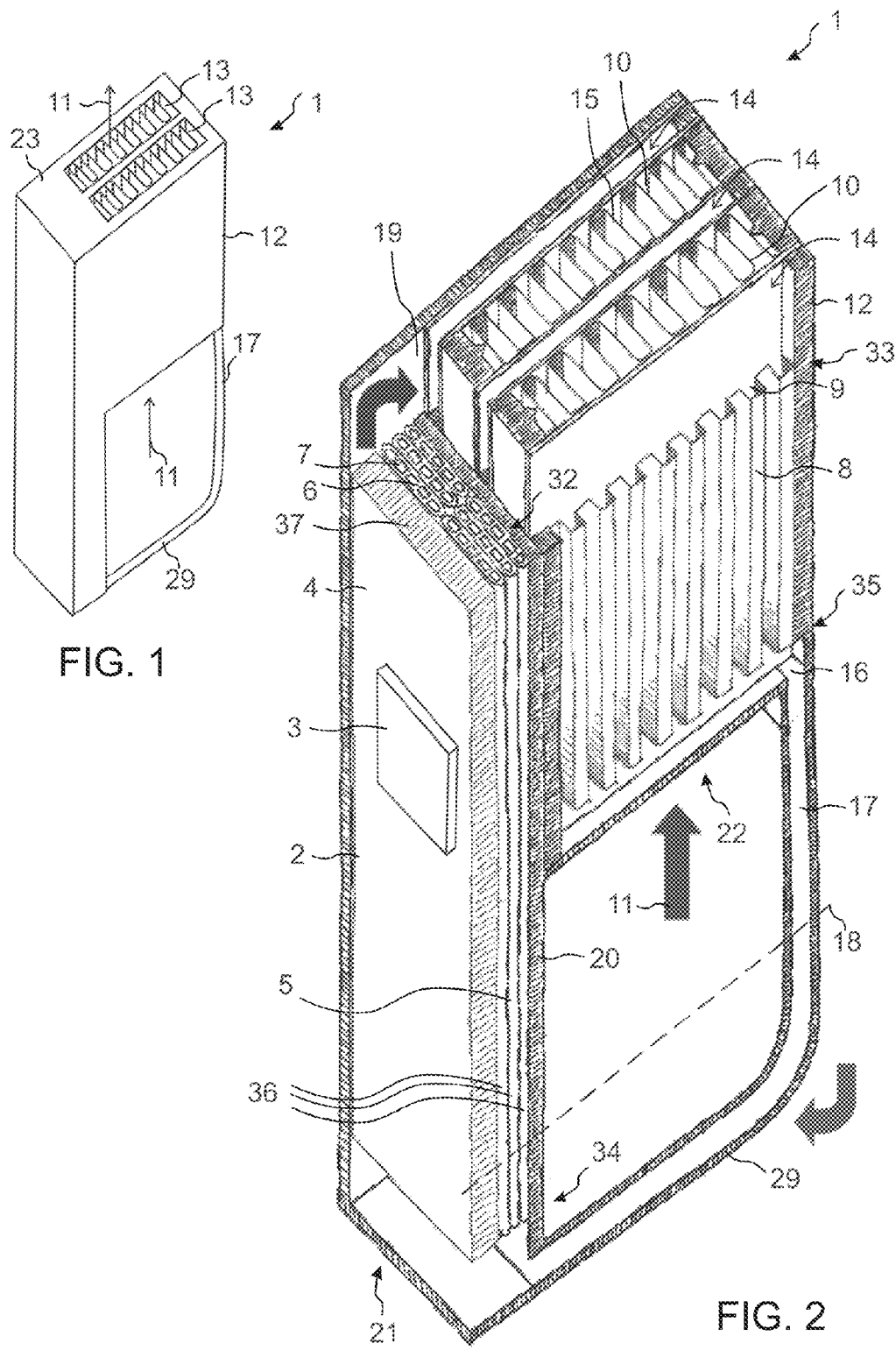
FIGS. 1 and 2 illustrate a first embodiment of a heat exchanger.

FIGS. 1 and 2 illustrate a first embodiment of a heat exchanger providing two-phase cooling. FIG. 1 illustrates an outside view of the heat exchanger 1 and FIG. 2 illustrates the interior of heat exchanger 1 after removal of some of the parts of the housing. In the following explanation it will by way of example been assumed that the illustrated heat exchanger is a loop-type thermosyphon providing convection cooling, which is also known as confined space boiling and which has a better overall thermal efficiency than pool boiling.

The heat exchanger 1 comprises a base plate 2 with a first surface for receiving a heat load from one or more electric components 3. One alternative is that the one or more electric components 3 are attached to the first surface 4 of the base plate, as in the illustrated example.

An evaporator 5 with tubes 36 having internal longitudinal walls 6 dividing the tubes 36 into evaporator channels 7 is in thermal contact with a second surface of the base plate for transferring the heat load received by the base plate 2 into a first fluid in the evaporator channels 7. The tubes 36 may be MPE tubes (Multi-Port Extruded) extruded of aluminum, for instance. In the illustrated example a plurality of such flat tubes 36 are stacked against each other along the second surface of the base plate 2 to be parallel with each other such that the evaporator channels 7 of the tubes 36 extend parallel with each other, which ensures that the evaporator can handle a high heat flux density. In the illustrated example, the second surface of the base plate is an opposite surface to the first surface 4. The heat received by the fluid in the evaporator channels 7 causes the first fluid to evaporate and to move upwards to the upper ends 32 of the evaporator channels 7. The upper ends 32 of the evaporator channels refers to the location where the upper openings facilitating fluid flow out from the evaporator channels are located.

The heat exchanger also comprises a condenser 8 with condenser channels 9 having upper ends 33 for receiving the first fluid from upper ends 32 of the evaporator channels 7. The upper ends 33 of the condenser channels 9 are on a vertical level which is generally the same as the level of the upper ends 32 of the evaporator channels 7. "Generally" refers to a solution where the upper ends 33 of the condenser channels 9 and the upper ends 32 of the evaporator channels 7 are approximately on the same level, though for the practical design a slight height difference may exist.

In the illustrated example, an upper end 37 of the base plate 2 is on a vertical level which is higher up or on the same vertical level as the upper ends 33 of the condenser channels 9. The upper ends 33 of the condenser channels 9 refers to the location where the upper openings of the condenser channels 9 facilitating fluid flow into the condenser channels 9 are located.

In FIG. 2 the upper end 37 of the base plate 2 is located on the same vertical level as the upper ends 32 of the evaporator channels 7. However, in other implementations the upper end of the base plate may be located on a level which is lower than the upper ends of the evaporator channels, or alternatively, on a level which is higher than the upper ends of the evaporator channels. In practice, the base plate may extend all the way to the inner surface of the roof 23, such that the upper end 37 of the base plate is in contact or almost in contact with the inner surface of the roof 23.

The condenser 8 transfers heat from the first fluid such that condensation occurs and the first fluid returns into a liquid state in the condenser. In order to facilitate dissipation the heat exchanger is provided with a flow channel 10 for a second fluid 11. In the illustrated example it is by way of example assumed that the second fluid 11 is air which is introduced into two flow channels 10 from inlets in a bottom of the housing 12 and which is expelled from the flow channels via outlets 13 in a roof 23 of the housing 12. Naturally, in some implementations the flow direction of the second fluid may be opposite. In the illustrated example, the condenser has been implemented with three corrugated plates arranged at three different locations 14, in other words on both sides of the flow channels 10 and also in the space between the tight walls of the flow channels 10. The flow channels 10 are provided with fins 15 in order to make the dissipation of heat more efficient.

The heat exchanger 1 is provided with a collector space 16 which receives first fluid from the condenser 8. In the illustrated embodiment the collector is arranged at a level below the condenser to receive first fluid from lower ends 35 of a plurality of the condenser channels 9. Consequently, with suitable piping, the first fluid coming out from the different parts of the condenser can be collected. The collector space 16 is in fluid communication 17 with the lower ends 34 of the evaporator channels 7 for passing first fluid received from the lower ends 35 of the condenser channels 8 to the lower ends 34 of the evaporator channels 7. In the illustrated example, this fluid communication 17 is implemented with a return tube 29 providing a single flow channel for the liquid moving towards the evaporator due to gravity. The lower ends 35 of the condenser channels 9 refers to the location where the lower openings facilitating fluid flow out from the condenser channels 9 and into the collector space 16 are located. The lower ends 34 of the evaporator channels refers to the location where the lower openings facilitating fluid flow into the evaporator channels 7 are located.

As can be seen in particular in FIG. 2, the evaporator 5 and condenser 8 are arranged substantially in an upright position along each other such that the upper ends 32 of the evaporator channels 7 and the upper ends 33 of the condenser channels 9 are approximately at the same vertical level. In praxis the condenser may be entirely located at a level between the upper and lower ends of the evaporator, alternatively a slight portion of it, such as less than 10% of its length, may be located above the level of the upper end of the evaporator. However, the evaporator 5 is longer than the condenser 8. The total length of the condenser (in the vertical direction) may be about half of the total length of the evaporator. Consequently, the lower ends 34 of the evaporator channels 7 are located below the level of the lower ends 35 of the condenser channels 9. This ensures that if first fluid in liquid state accumulates in the lower part of the heat exchanger 1 to a height illustrated by line 18, for instance, the condenser channels 9 are in such a case not flooded by first fluid in liquid state, but instead contain only vapor and the amount of first fluid in liquid state which at that particular moment is moving downwards through the condenser channels 9 towards the collector space 16. Such a non-flooded condenser dissipates heat efficiently with its entire surface area.

The condenser 8 may be dimensioned in such a way that the first fluid which in liquid state is returned from the condenser 8 to the evaporator 5 via the collector space 16 is saturated and not subcooled. This ensures that it will start to boil immediately once heat is passed to it in the evaporator 5. This helps to ensure that the temperature of the base plate 2 remains approximately constant over the entire surface area of the base plate 2 and that an efficient bubble pump effect is achieved within the evaporator channels 7. In order to ensure this, the evaporator channels 7 are preferably capillary sized channels. In this context "capillary sized" refers to channels that have a size small enough for bubbles to grow uniquely in a longitudinal direction (in other words in the longitudinal direction of the channel as opposed to the radial direction) and thereby create a so called bubble lift effect by pushing the liquid upwards. The diameter of a channel which is considered capillary depends on the first fluid or refrigerant that is used (boiling) inside. The following formula, for instance, can be used to evaluate a suitable diameter: $D=(sigma/(g*(rhol-rhov)))^{0.5}$, wherein sigma is the surface tension, g the acceleration of gravity, rhov the gas density and rhol the liquid density. For a commonly used fluid sold by the company DuPont with the trademark "Freon", for instance, typically the internal diameter of such capillary channels is around 1.5 mm. Therefore, bubbles will grow along the channels direction towards the lowest pressure point only and therefore push liquid up to the top of the evaporator channels 7.

Instead of providing a fluid path between the upper ends 32 of the evaporator channels 7 and the upper ends 33 of the condenser channels 9 via pipes, a chamber 19 is provided in the upper end of the heat exchanger 1. In the illustrated example this chamber 19 has been formed by dimensioning a fluid tight wall 20 which separates a first section 21 of the housing 12 of the heat exchanger 1 from a second section 22 of the housing of the heat exchanger 1 in such a way that this tight wall 20 does not reach all the way to the roof 23 of the housing 12. Consequently a chamber 19 providing a fluid path between the first section 21 containing the evaporator 5 and the second section 22 containing the condenser 8 is formed. An advantage in using such a chamber 19 to provide a fluid path between the upper ends 32 of the evaporator channels 7 and the upper ends 33 of the condenser channels 9 is that pressure losses are minimized and the first fluid which is in vapor state is uniformly distributed in the condenser. The chamber 19 may easily be dimensioned to be sufficiently large, such that it provides a cross-sectional flow area which is larger than the combined cross-sectional flow area of the upper ends 32 of all the evaporator channels 7, for instance.

As is clear from the above explanation fluid circulation of the first fluid within the fluid tight housing occurs without the need to utilize a pump. As gravity is utilized for returning condensed first fluid in a liquid state from the condenser to the evaporator, the heat exchanger 1 needs to be in a mainly upright position during use. The illustrated heat exchanger may be manufactured of metal plates, bars and extruded tubes which are cut into suitable dimensions and attached to each other by brazing, for instance. Due to this the manufacturing costs of the heat exchanger can be kept low and the heat exchanger can be manufactured into desired dimensions, such as to replace conventional heat sinks in existing electric cabinets, where cooling is based solely on dissipation of heat into an airflow without use of any cooling fluid circulating within the heat sink.

Figure 3:
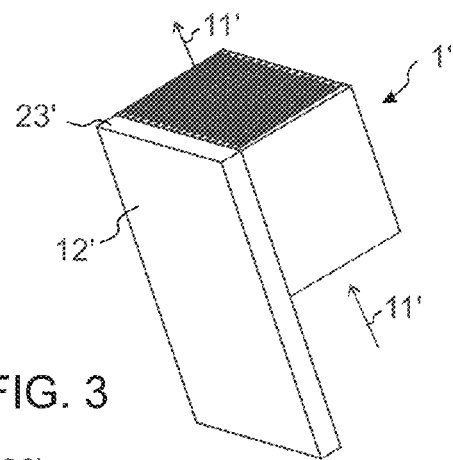
FIGS. 3 and 4 illustrate a second embodiment of a heat exchanger.
Figure 4:
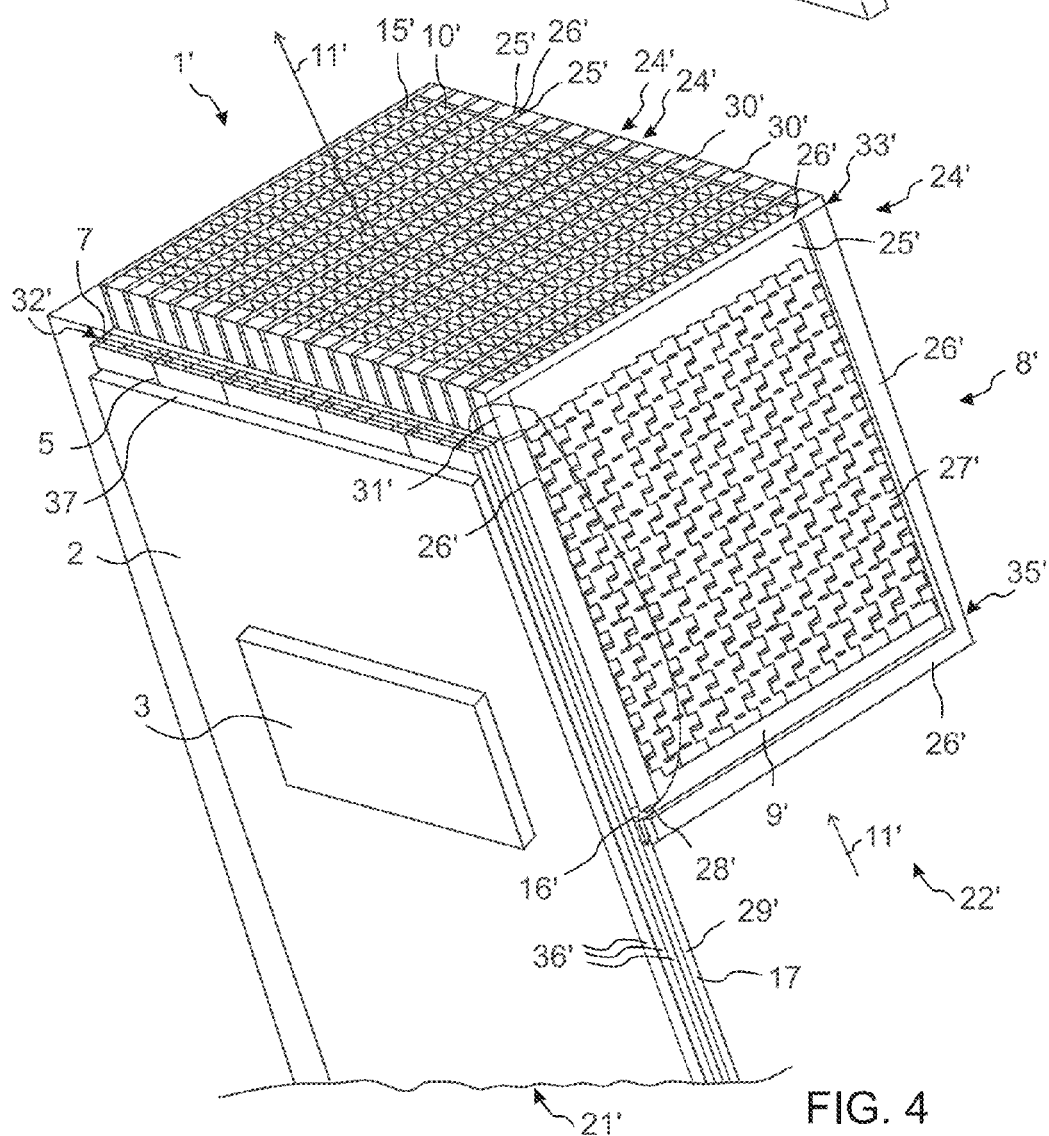

FIGS. 3 and 4 illustrate a second embodiment of a heat exchanger 1'. The second embodiment is very similar to the one explained in connection with FIGS. 1 and 2. Therefore, in the following the embodiment of FIGS. 3 and 4 will be mainly explained by pointing out the differences between these embodiments.

FIG. 3 illustrates an outside view of the heat exchanger 1' and FIG. 4 illustrates the interior of heat exchanger 1' after removal of some of the parts of the housing. Also the lower parts of the heat exchanger 1' are left out from FIG. 4.

Similarly as in the previous embodiment, the heat exchanger 1' comprises a base plate 2 receiving heat from one or more electric components 3, and a plurality of MPE tubes stacked against each other to provide evaporator channels 7 for the evaporator 5. In this embodiment, the condenser 8' is implemented to include a plurality of assemblies 24'. Each assembly includes a pair of plates 25' with spacer elements 26' arranged along the edges of the plates 25' to keep the plates at a distance from each other. Consequently a gap is provided between each pair of plates 25'.

This gap which is limited by the plates 25' and the spacer elements 26' provides a condenser channel 9'. In order to enhance the surface area coming into contact with the first fluid, offset strips 27' may be arranged in this gap, as illustrated in FIG. 4. These offset strips 27' may be useful in breaking down the liquid layer decreasing the condensation thermal resistance which is proportional to the thickness of the liquid film.

A gap 31' in the upper front end of each assembly 24' (by removal of a part of the space elements 26') allows first fluid from the upper ends 32' of the evaporator channels 7 to enter the condenser channels 9' provided by the plates 25', the spacer elements 26' and the offset strips 27'. Similarly a gap 28' in the lower front end of each assembly 24' (by removal of a part of the space elements 26') allows the first fluid to exit the condenser channels 9' and to enter the collector space 16'.

From FIG. 4 it can be seen that the evaporator channels 7 are aligned with the gaps 31' such that fluid exiting the evaporator channels 7 is essentially in line with the inlets (gaps 31') of the condenser channels 9'. This minimizes pressure drop. Naturally, in some embodiment alignment of all evaporator channels with the inlets to the condenser channels is not necessary. From FIG. 4 it can also be seen that the upper ends 33' of the condenser channels 9' are on a vertical level which is generally the same as the level of the upper ends 32' of the evaporator channels 7. Due to the design of the condenser channels, the condenser channels may extend slightly above the level of the upper ends 32' of the evaporator channels 7, however, this height difference is marginal.

In the embodiment of FIGS. 3 and 4 the fluid communication 17' between the collector space 16' and the lower ends 35' of the evaporator channels (not illustrated in FIG. 4) is implemented with tubes 29'. Therefore, instead of providing a single separate return tube as in the embodiment of FIGS. 1 and 2, an additional layer of MPE tubes may be stacked against the tubes 36' providing the evaporator channels 7 and which are stacked against the second surface of the base plate, and this additional layer of tubes 29' is utilized as the return tube providing the fluid communication 17' from the collector space 16' to the lower ends of the evaporator channels 7. An advantage with such a solution is that no separate return tube needs to be located outside of the housing 12, as illustrated in FIG. 1, but instead also the tubes 29' utilized as the return tube can be enclosed into the housing 12' of the heat exchanger, in praxis in the first section 21', as can be seen in FIG. 3.

Similarly as in the embodiment of FIGS. 1 and 2 flow channels 10' with fins 15' are provided through the condenser 8' for allowing a second fluid 11 to pass through the condenser 8' such that heat can be dissipated from the condenser 8' to the second fluid 11', which may be air. In the embodiment of FIGS. 3 and 4 these flow channels 10 are located between the assemblies 24' which are separated from each other by spacer bars 30'.

In FIG. 4 the base plate 2 does not extend all the way to the upper ends 32' of the evaporator channels 7 in order to more clearly illustrate the upper end of the evaporator in this figure. However, in many implementations it is advantageous to utilize a base plate 2 extending all the way to the upper ends 32' of the evaporator channels 7, in which case the upper end 37 of the base plate 2 is on the same vertical level with the upper ends 32' of the evaporator channels 7. The base plate 10 may even extend beyond the upper end 32' of the evaporator channels 7 such that it makes contact or almost makes contact with the inner surface of the roof 23'.

It is to be understood that the above description and the accompanying figures are only intended to illustrate the present invention. It will be obvious to a person skilled in the art that the invention can be varied and modified without departing from the scope of the invention.

The invention claimed is:

1. A heat exchanger of a loop thermosyphon type comprising:
 a base plate with a first surface for receiving a heat load from one or more electric components,
 an evaporator with evaporator channels, the evaporator being in thermal contact with a second surface of the base plate for transferring said heat load into a first fluid in the evaporator channels,
 a condenser with condenser channels having upper ends for receiving first fluid from upper ends of the evaporator channels and for dissipating heat from the first fluid in the condenser channels, and
 a collector space for receiving first fluid from the condenser, wherein the collector space is located higher than the lower ends of the evaporator channels and is in fluid communication with lower ends of the evaporator channels,
 wherein the evaporator is provided with individual tubes having internal longitudinal walls dividing the tubes into the evaporator channels, and
 wherein the evaporator comprises a plurality of said individual tubes stacked against each other along the second surface of the base plate to be parallel with each other such that the evaporator channels of the tubes extend parallel with each other, and
 wherein the first fluid received from the condenser to the collector space is passed to the lower ends of the evaporator channels in an operating state of the heat exchanger,
 wherein the heat exchanger comprises a chamber in an upper part of the heat exchanger which is in fluid communication with the upper ends of the evaporator channels and with the upper ends of the condenser channels for passing the first fluid from the evaporator to the condenser, and
 wherein the heat exchanger is enclosed by a housing having a first section where the base plate and the evaporator are arranged in a vertical position, and a second section where the condenser is arranged in a vertical position.

2. The heat exchanger according to claim 1, wherein the heat exchanger comprises a chamber in an upper part of the heat exchanger which is in fluid communication with the upper ends of the evaporator channels and with the upper ends of the condenser channels for passing first fluid from the evaporator to the condenser.

3. The heat exchanger according to claim 2, wherein the cross-sectional flow area of the chamber passing first fluid from the evaporator to the condenser is larger than the combined cross-sectional flow area of the upper ends of all the evaporator channels.

4. The heat exchanger according to claim 1, wherein the heat exchanger comprises a flow channel for a second fluid in thermal contact with the condenser for receiving the heat dissipated from the first fluid.

5. The heat exchanger according to claim 1, wherein the collector space is located at a level below the condenser, a return tube extends from the collector space to a bottom part of the first section for providing fluid communication between the condenser and the lower parts of the evaporator channels, and a flow channel for a second fluid has fluid tight walls and extends in a vertical direction through the second section.

6. The heat exchanger according to claim 5, wherein the return tube extending from the collector space to the bottom part of the first section extends within the tight housing.

7. The heat exchanger according to claim 5, wherein the return tube is a tube having internal longitudinal walls dividing the tube into channels.

8. The heat exchanger according to claim 4, wherein the second fluid is air and the flow channel is provided with fins for dissipating heat into air flowing through the flow channel.

9. The heat exchanger according to claim 1, wherein the condenser channels are provided by assemblies comprising a pair of plates with spacer elements separating the plates from each other in order to provide condenser channels which are limited by the plates and the spacer elements.

10. The heat exchanger according to claim 1, wherein the length of the condenser is smaller than the length of the evaporator.

11. The heat exchanger according to claim 1, wherein the upper ends of the evaporator channels are aligned with gaps in the upper ends of the condenser channels which allow fluid to enter the condenser channels from the evaporator channels.

12. The heat exchanger according to claim 1, wherein the upper ends of the condenser channels are on a vertical level which is generally the same as the vertical level of the upper ends of the evaporator channels.

13. The heat exchanger according to claim 1, wherein an upper end of the base plate is on a vertical level which is higher up or on the same vertical level as the upper ends of the condenser channels.

14. The heat exchanger according to claim 1, which further comprises a power module comprising one or more electric components thermally connected to the base plate.

15. The heat exchanger according to claim 2, wherein the heat exchanger comprises a flow channel for a second fluid in thermal contact with the condenser for receiving the heat dissipated from the first fluid.

16. The heat exchanger according to claim 3, wherein the heat exchanger comprises a flow channel for a second fluid in thermal contact with the condenser for receiving the heat dissipated from the first fluid.

17. The heat exchanger according to claim 2, wherein the heat exchanger is enclosed by a tight housing having a first section where the base plate and the evaporator are arranged in a vertical position, and a second section where the condenser is arranged in a vertical position, the collector space is located at a level below the condenser, a return tube extends from the collector space to a bottom part of the first section for providing fluid communication between the condenser and the lower parts of the evaporator channels, and a flow channel for a second fluid has fluid tight walls and extends in a vertical direction through the second section.

18. The heat exchanger according to claim 3, wherein the heat exchanger is enclosed by a tight housing having a first section where the base plate and the evaporator are arranged in a vertical position, and a second section where the condenser is arranged in a vertical position, the collector space is located at a level below the condenser, a return tube extends from the collector space to a bottom part of the first section for providing fluid communication between the condenser and the lower parts of the evaporator channels, and a flow channel for a second fluid has fluid tight walls and extends in a vertical direction through the second section.

19. The heat exchanger according to claim 4, wherein the heat exchanger is enclosed by a tight housing having a first section where the base plate and the evaporator are arranged in a vertical position, and a second section where the condenser is arranged in a vertical position, the collector space is located at a level below the condenser, a return tube extends from the collector space to a bottom part of the first section for providing fluid communication between the condenser and the lower parts of the evaporator channels, and a flow channel for a second fluid has fluid tight walls and extends in a vertical direction through the second section.

20. The heat exchanger according to claim 6, wherein the return tube is a tube having internal longitudinal walls dividing the tube into channels.

* * * * *